United States Patent
Trezise et al.

(10) Patent No.: US 10,204,008 B2
(45) Date of Patent: Feb. 12, 2019

(54) MEMORY MODULE HAVING ERROR CORRECTION LOGIC

(71) Applicant: HEWLETT-PACKARD DEVELOPMENT COMPANY, L.P., Houston, TX (US)

(72) Inventors: Gregory Trezise, Gifford Bristol (GB); Andrew Hana, Gifford Bristol (GB)

(73) Assignee: Hewlett Packard Enterprise Development LP, Houston, TX (US)

( * ) Notice: Subject to any disclaimer, the term of this patent is extended or adjusted under 35 U.S.C. 154(b) by 116 days.

(21) Appl. No.: 14/433,675

(22) PCT Filed: Dec. 21, 2012

(86) PCT No.: PCT/US2012/071222
§ 371 (c)(1),
(2) Date: Apr. 5, 2015

(87) PCT Pub. No.: WO2014/098890
PCT Pub. Date: Jun. 26, 2014

(65) Prior Publication Data
US 2015/0278017 A1    Oct. 1, 2015

(51) Int. Cl.
*G06F 11/00* (2006.01)
*G06F 11/10* (2006.01)
(Continued)

(52) U.S. Cl.
CPC .......... *G06F 11/1076* (2013.01); *G06F 3/064* (2013.01); *G06F 3/0619* (2013.01);
(Continued)

(58) Field of Classification Search
CPC ............ G06F 11/1008; G06F 11/1068; G06F 11/1044; G06F 11/1052; G06F 3/0619;
(Continued)

(56) References Cited

U.S. PATENT DOCUMENTS

| | | | | |
|---|---|---|---|---|
| 4,249,253 A | * | 2/1981 | Gentili | G06F 11/1052 714/54 |
| 5,606,662 A | * | 2/1997 | Wisor | G06F 11/1052 714/48 |

(Continued)

FOREIGN PATENT DOCUMENTS

| | | |
|---|---|---|
| KR | 20090005549 | 9/2014 |
| WO | WO-2009107267 A1 | 9/2009 |
| WO | WO-2012039983 A1 | 3/2012 |

OTHER PUBLICATIONS

Gharachorloo, K,et.al, "Efficient ECC-based Directory Implementations for Scalable Muiliprocessors", Presented at the 12th Symposium on Computer Architecture and High-Performance Computing, Oct. 2000, 8 pages.

(Continued)

*Primary Examiner* — Albert DeCady
*Assistant Examiner* — Osman M Alshack
(74) *Attorney, Agent, or Firm* — Trop, Pruner & Hu P.C.

(57) ABSTRACT

A memory module includes an error correction logic to provide data error protection for data stored in the memory module. The error correction logic is selectively controllable between an enabled state and a disabled state. Data stored in the memory module is without error protection provided by the memory module if the error correction logic is in the disabled state.

16 Claims, 2 Drawing Sheets

(51) Int. Cl.
*G11C 5/04* (2006.01)
*G06F 3/06* (2006.01)
*G11C 29/02* (2006.01)
*G11C 29/42* (2006.01)
*G11C 29/52* (2006.01)
*G11C 29/04* (2006.01)

(52) U.S. Cl.
CPC .......... *G06F 3/0673* (2013.01); *G06F 3/0683* (2013.01); *G06F 11/1052* (2013.01); *G11C 5/04* (2013.01); *G11C 29/028* (2013.01); *G11C 29/42* (2013.01); *G11C 29/52* (2013.01); *G11C 2029/0409* (2013.01); *G11C 2029/0411* (2013.01)

(58) Field of Classification Search
CPC .. G06F 11/1076; G06F 3/0673; G06F 3/0683; G06F 3/064; G11C 5/04
USPC ........................................ 714/763, 766, 768
See application file for complete search history.

(56) References Cited

U.S. PATENT DOCUMENTS

| | | | | |
|---|---|---|---|---|
| 5,961,660 | A * | 10/1999 | Capps, Jr. ............ | H03M 13/35 714/752 |
| 7,051,166 | B2 * | 5/2006 | Sharma ................ | G06F 12/0817 711/144 |
| 7,096,407 | B2 | 8/2006 | Olarig | |
| 7,370,230 | B1 * | 5/2008 | Flake .................. | G06F 11/1008 714/10 |
| 8,015,345 | B2 | 9/2011 | Laurent et al. | |
| 8,103,936 | B2 * | 1/2012 | Pekny ................. | G06F 13/4291 714/763 |
| 8,683,295 | B1 * | 3/2014 | Syu ..................... | G06F 11/1048 714/746 |
| 2001/0029592 | A1 | 10/2001 | Walker et al. | |
| 2003/0154437 | A1 | 8/2003 | Chih | |
| 2006/0158999 | A1 | 7/2006 | Blum et al. | |
| 2007/0011562 | A1 * | 1/2007 | Alexander ........... | G06F 11/1004 714/758 |
| 2007/0044004 | A1 | 2/2007 | Hino et al. | |
| 2007/0186040 | A1 | 8/2007 | Kasahara et al. | |
| 2008/0077840 | A1 | 3/2008 | Shaw et al. | |
| 2008/0098277 | A1 * | 4/2008 | Hazelzet .............. | G06F 11/1044 714/753 |
| 2009/0016103 | A1 | 1/2009 | Kang et al. | |
| 2009/0055714 | A1 | 2/2009 | Bains et al. | |
| 2009/0063934 | A1 | 3/2009 | Jo | |
| 2009/0113272 | A1 * | 4/2009 | Tan ..................... | G06F 11/1052 714/765 |
| 2009/0164704 | A1 * | 6/2009 | Kanade ............... | G06F 11/1068 711/103 |
| 2009/0183053 | A1 | 7/2009 | Ito et al. | |
| 2009/0282308 | A1 | 11/2009 | Gutsche et al. | |
| 2010/0100797 | A1 | 4/2010 | Chen | |
| 2010/0211851 | A1 | 8/2010 | Dixon | |
| 2011/0078541 | A1 | 3/2011 | Lee et al. | |
| 2011/0239064 | A1 | 9/2011 | Byom et al. | |
| 2012/0144264 | A1 * | 6/2012 | Bains .................. | G06F 11/1052 714/758 |
| 2012/0266041 | A1 | 10/2012 | Wang et al. | |
| 2012/0278681 | A1 * | 11/2012 | Moyer ................ | G06F 11/1016 714/763 |
| 2013/0054885 | A1 * | 2/2013 | Choi .................. | G11C 5/04 711/105 |
| 2013/0283126 | A1 * | 10/2013 | Ramaraju ........... | G06F 11/1064 714/763 |
| 2014/0149822 | A1 * | 5/2014 | Wilkerson .............. | G06F 11/08 714/763 |

OTHER PUBLICATIONS

ISR/WO, PCT/US2012/071222, HP reference 83102584, Sep. 16, 2013, 12 pps.
Extended European Search Report received in EP Application No. 12890251.7, dated Dec. 15, 2016, 10 pages.
Wikipedia, "Hamming code," Nov. 30, 2012, <https://en.wikipedia.org/w/index.php?title=Hamming_code&oldid=525653823> (8 pages).
Wikipedia, "Reed-Solomon error correction," Dec. 4, 2012, <https://en.wikipedia.org/w/index.php?title=Reed%E2%80%93Solomon_error_correction&oldid=526321522> (15 pages).
Eliot Eshelman, "nvidia-smi: Control Your GPUs," (web forum), Dec. 5, 2011, https://web.archive.org/web/20130905053528/http://www.microway.com:80/hpc-tech-tips/nvidia-smi_control-your-gpus/ (4 pages).
Mentalgenie et al., "ECC Configuration with nvidia-smi on GPU Instance," Nov. 16, 2010, (web forum), <https://forums.aws.amazon.com/message.jspa?messageID=214473> (3 pages).
Nvidia Corporation, "nvidia-smi 2.285," (nvidia-smi documentation), Aug. 29, 2011, <http://developer.download.nvidia.com/devzone//devcenter/cuda/files/CUDADownloads/NVML/nvidia-smi.2.285.pdf> (10 pages).
Nvidia Corporation, "NVML API Reference Manual," Apr. 20, 2012, <https://web.archive.org/web/20120522213504/http://developer.download.nvidia.com/assets/cuda/files/CUDADownloadsi/NVML/nvml.pdf> (86 pages).
European Patent Office, "Communication under Rule 71(3) EPC,", received in EP Application No. 12890251.7, dated May 4, 2018, 23 pages.
Extended European Search Report received in EP Application No. 18184850.8, dated Nov. 27, 2018, 8 pages.

* cited by examiner

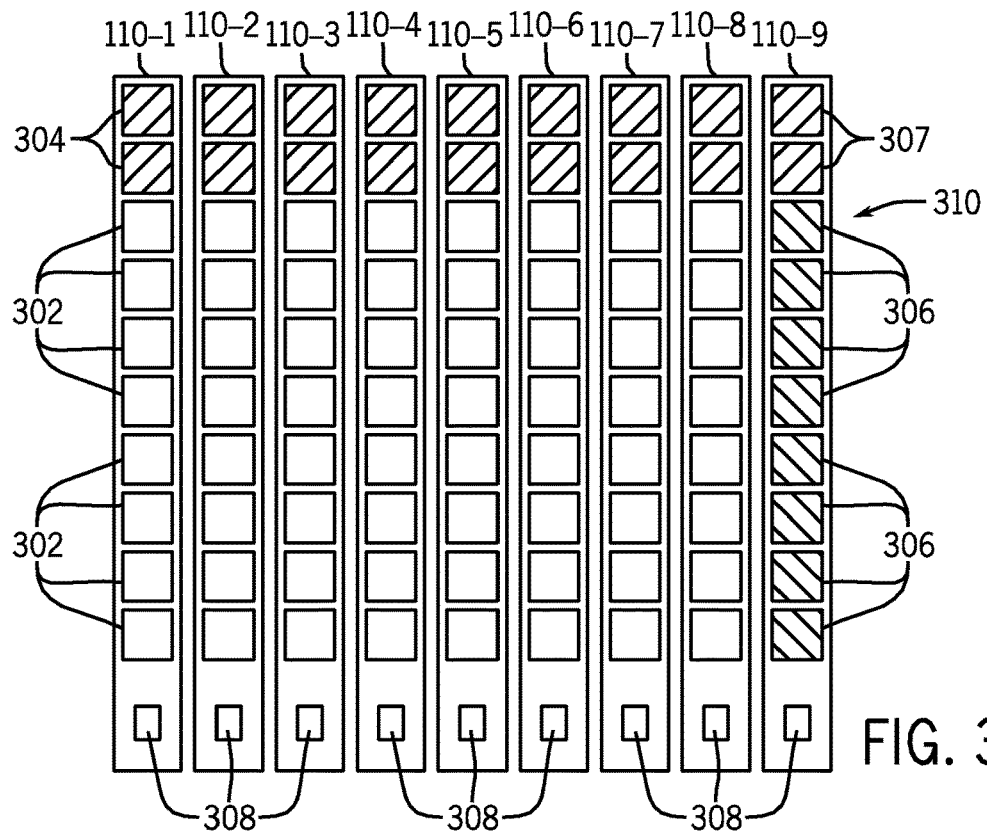
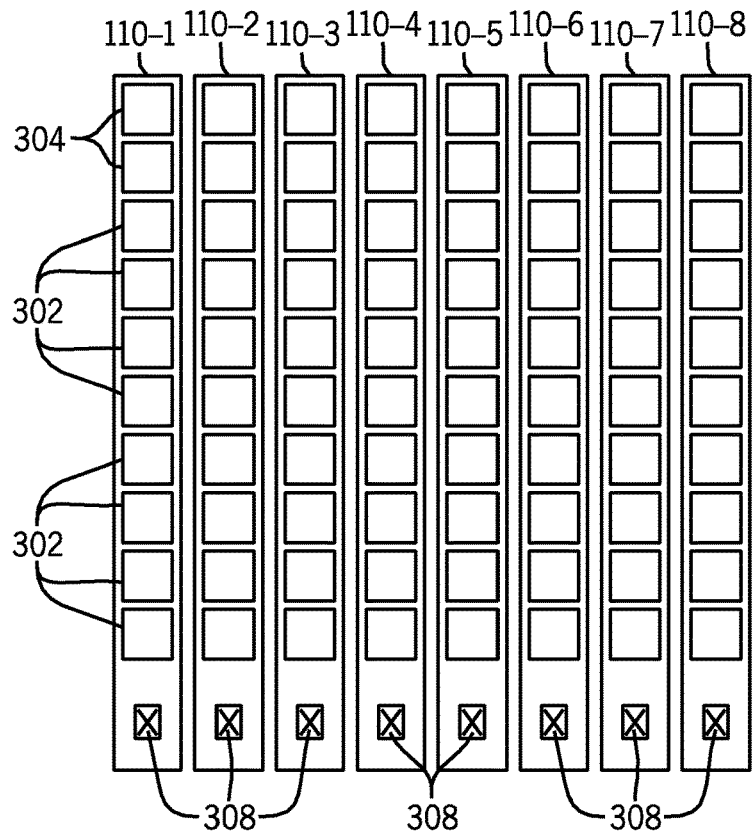

MEMORY MODULE HAVING ERROR CORRECTION LOGIC

CROSS-REFERENCE TO RELATED APPLICATION

This application is a national stage application under 35 U.S.C. § 371 of PCT/US2012/071222, filed Dec. 21, 2012.

BACKGROUND

In an electronic device, a memory module can be used to store data and machine-readable instructions. A memory module can be implemented using a dynamic random access memory (DRAM), flash memory, or another type of memory. To protect data stored in the memory, error detection and correction can be performed. Error detection and correction can be based on error correction codes that are stored in conjunction with data.

BRIEF DESCRIPTION OF THE DRAWINGS

Some embodiments are described with respect to the following figures:

FIG. 3 is a block diagram of a memory module with error correction logic enabled; and FIG. 4 is a block diagram of a memory module with error correction logic disabled, in accordance with some implementations.

DETAILED DESCRIPTION

Figure 1:
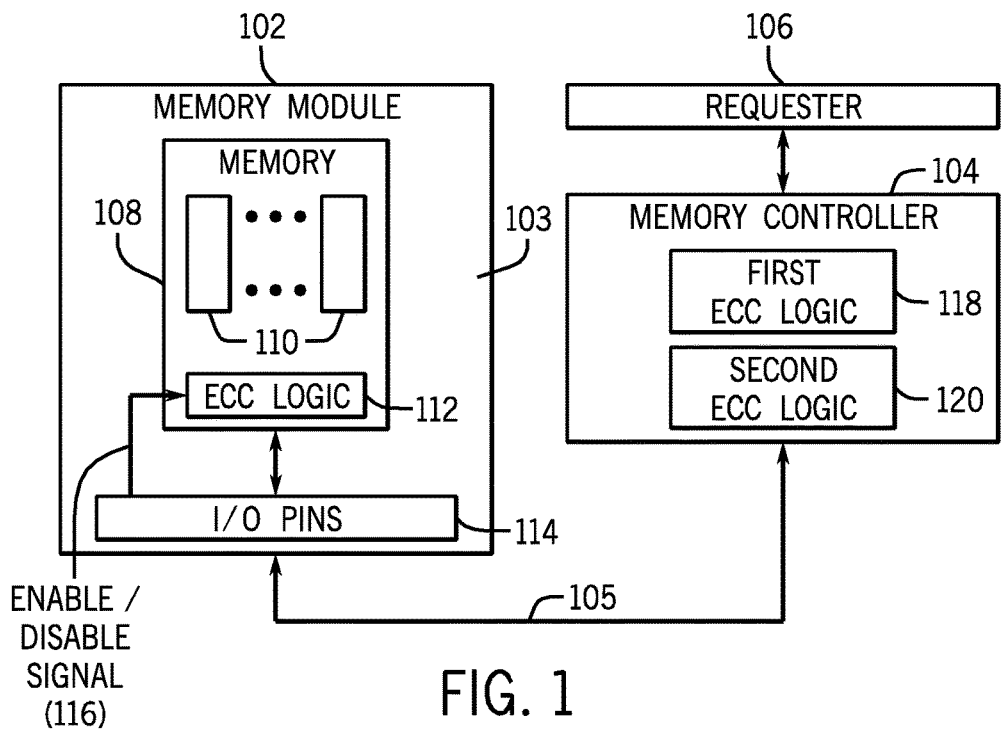
FIG. 1 is a block diagram of an example arrangement that includes a memory module, a memory controller, and a data requester, according to some implementations.

To protect data in a memory module, various error detection and correction techniques can be employed. Error detection and correction techniques can also be referred to as error correction code (ECC) techniques. As an example, one type of an ECC technique is a Single Error Correction and Double Error Detection (SECDED) technique, which is capable of correcting single-bit data errors, and detecting up to double-bit data errors. The SECDED technique can be implemented with combinatorial hardware circuitry, and is thus considered to be a relatively fast ECC technique. Another type of an ECC technique is a Reed-Solomon block ECC technique, which is a more powerful and efficient ECC technique that is capable of detecting and correcting more data error bits than the SECDED technique. However, the Reed-Solomon block ECC technique is computationally more expensive and can take a longer computation time than the SECDED technique.

Relatively fast ECC techniques such as the SECDED technique can be implemented in memory-mapped storage, which is storage that is relatively closely aligned with a processor or other data requester of an electronic device. Memory mapped storage is designed to have relatively fast access times to improve performance of the processor or other data requester.

On the other hand, a relatively slow ECC technique such as the Reed-Solomon block ECC technique can be used with block storage, which can be implemented with relatively slow storage, such as disk-based storage devices or solid-state storage devices such as flash memory devices. "Block storage" can refer to storage that stores data in predefined blocks, which can be relatively large blocks (e.g. a sector on a disk-based storage device, or a block of a solid-state storage device). A block storage can be used as the secondary, persistent storage of an electronic device.

Since block storage can tolerate relatively slow access times, a slower ECC technique (such as the Reed-Solomon block ECC technique), which is relatively powerful but exhibits relatively slow computational times, can be used.

Traditionally, different types of storage (e.g. memory mapped storage and block storage) are implemented with corresponding different storage modules.

In accordance with some implementations, a memory module is selectively usable as either a memory mapped storage or as a block storage. More generally, a memory module according to some implementations is selectively useable in any of multiple modes. A memory module refers to an assembly that includes a memory (which can be implemented with one or multiple memory devices) and associated circuitry. In some examples, the memory module can include a circuit board (or other support substrate) on which memory device(s) and associated circuitry can be mounted. For example, a memory module can be a dual in-line memory module (DIMM), which can include dynamic random access memory (DRAM) devices mounted on a circuit board. In other examples, other types of memory modules that include other types of memory devices can be used. More generally, a memory module can include one type of memory device(s) or multiple different types of memory devices, including as examples DRAM devices, static random access memory (SRAM) devices, flash memory devices, and so forth.

To support the selective use of a memory module as either memory mapped storage or block storage, different ECC techniques can be selectively used. As an example, if the memory module is used as a memory mapped storage, then a relatively fast ECC technique such as the SECDED technique can be activated. On the other hand, if the memory module is used as a block storage, then a more powerful ECC technique such as the Reed-Solomon block ECC technique can be activated.

FIG. 1 is a block diagram of an example arrangement (e.g. electronic device) that includes a memory module 102, a memory controller 104 that manages the access of data stored in the memory module 102, and a requester 106 that is able to submit data requests (e.g. read requests and write requests) to the memory controller 104. The electronic device can be a computer, a smartphone, a personal digital assistant, a game appliance, a storage system, a network router or switch, and so forth. The requester 106 can be a processor. Alternatively, the requester 106 can be an input/output (I/O) device that is able to access data stored in the memory module 102.

The requester 106 submits a data request to the memory controller 104. In response to the data request, the memory controller 104 issues data access commands (read commands or write commands) to the memory module 102 to access data in the memory module 102.

The memory module 102 includes a memory 108 that has memory devices 110. In some examples, the memory module 102 includes a support substrate 103 (e.g. circuit board or other type of support substrate) on which the memory devices 110 can be mounted. The memory devices 110 in some examples can be discrete memory chips. For example, the memory chips can include any or some combination of the following: DRAM chips, SRAM chips, flash memory chips, or other types of memory chips. A memory chip can refer to a packaged integrated circuit (IC) memory device.

In other examples, the memory devices 110 can include respective blocks of memory cells arranged on a common IC substrate.

The memory 108 includes ECC logic 112 that can perform error detection and correction for protecting data stored in the memory devices 110. In some examples, the ECC logic 112 can include ECC engines provided in respective ones of the memory devices 110. Alternatively, the ECC logic 112 can be separate from the memory devices 110.

The memory module 102 further includes I/O pins 114 that are coupled to the memory bus 105 to allow for data and control signal communications between the memory module 102 and the memory controller 104.

In accordance with some implementations, the ECC logic 112 is selectively enabled or disabled, based on the selected mode of the memory module 102. For example, if the memory module 102 is to be used in a first mode (e.g. memory-mapped storage mode), the ECC logic 112 is enabled. On the other hand, if the memory module 102 is to be used in a second mode (e.g. block storage mode), the ECC logic 112 is disabled.

Enabling or disabling of the ECC logic 112 is controlled by an enable/disable signal 116, which can correspond to a control pin of the I/O pins 114. The state of the enable/disable signal 116 can be controlled by the memory controller 104, or by some other controller in the system. As yet another alternative, the control pin can be tied to one of several different voltages for enabling or disabling the ECC logic 112. For example, if the control pin is tied to a high voltage, the ECC logic 112 is enabled, whereas if the control pin is tied to a low voltage, the ECC logic 112 is disabled. Tying the control pin to the high voltage or low voltage can involve statically coupling the control pin to the high voltage or low voltage.

In other implementations, instead of using an I/O pin of the memory module 102 to enable or disable the ECC logic 112, a different control mechanism can be employed. For example, the memory module 102 can include a control register that can be programmed by the memory controller 104 or another controller. The control register can be programmed with a first value to enable the ECC logic 112, and with a second value to disable the ECC logic 112.

When the ECC logic 112 is disabled, then the memory 108 is to store data without any data error protection provided by the memory module 102. In other words, when the ECC logic 112 is disabled, no internal error detection and correction is performed in the memory module 102 for providing data error protection. In some examples, the ECC logic 112 can implement the SECDED technique. In other examples, the ECC logic 112 can implement a different ECC technique.

As depicted in FIG. 1, the memory controller 104 also includes a first ECC logic 118. In some implementations, the first ECC logic 118 of the memory controller 104 can be activated when the ECC logic 112 of the memory module 102 is disabled. The first ECC logic 118 of the memory controller 104 can be used to implement a more powerful ECC technique, such as the Reed-Solomon block ECC technique.

In some implementations, when the memory module 102 is configured to operate in a first mode (e.g. memory mapped storage mode), the ECC logic 112 in the memory module 102 is enabled, but the first ECC logic 118 in the memory controller 104 is disabled. On the other hand, if the memory module 102 is configured to operate in a second mode (e.g. block storage mode), the ECC logic 112 in the memory module 102 is disabled, but the first ECC logic 118 in the memory controller 104 is enabled.

Note that the first ECC logic 118 in the memory controller 104 is used to implement an ECC technique in place of the ECC technique of the ECC logic 112 module 102.

In further implementations, the memory controller 104 can also include a second ECC logic 120 that can be activated when the memory module 102 is configured to operate in the first mode. Thus, when the memory module 102 is configured to operate in the first mode, both the ECC logic 112 in the memory module 102 and the second ECC logic 120 in the memory controller 104 are enabled, but the first ECC logic 118 in the memory controller 104 is disabled. The second ECC logic 120 in the memory controller 104 is to cooperate with the ECC logic 112 in the memory module 102 to provide data error protection for data stored in the memory 108 of the memory module 102.

For example, the second ECC logic 120 can implement a SECDED or other ECC technique in addition to the SECDED technique provided by the ECC logic 112 in the memory module 102. The ECC logic 112 in the memory module 102 can be used to provide SECDED protection for data of each individual memory device 110, while the second ECC logic 120 in the memory controller 104 can be used to provide SECDED or other ECC protection for data across a number of the memory devices 110 (discussed further below).

Although the first ECC logic 118 and second ECC logic 120 are depicted as being part of the memory controller 104, it is noted that the first and/or second ECC logic 118 and 120 can be implemented in another device of the system, such as in the requester 106 or in some other device.

Figure 2:
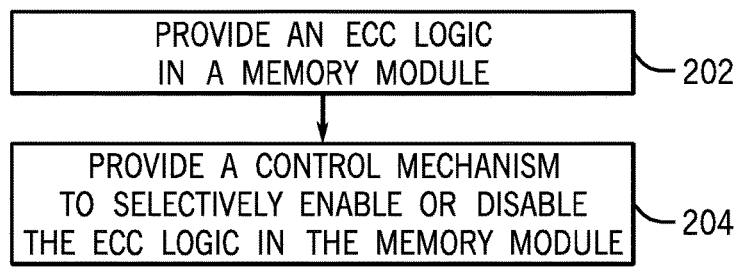
FIG. 2 is a flow diagram of an error correction process according to some implementations.

FIG. 2 is a flow diagram of a process of forming a memory module (e.g. memory module 102) in accordance with some implementations. The process of FIG. 2 includes providing (at 202) an ECC logic in the memory module for protecting data stored in a memory of the memory module. The process further includes providing (at 204) a control mechanism to selectively enable and disable the ECC logic in the memory module. The control mechanism can enable the ECC logic in the memory module when the memory module operates in a first mode, and the control mechanism can disable the ECC logic in the memory module when the memory module operates in a second mode.

FIG. 3 is a block diagram of an example arrangement of the memory module 102 when the memory module 102 is selected to operate in the first mode. In the example of FIG. 3, the memory module 102 includes nine memory chips 110-1 to 110-9. In other examples, the number of memory chips in the memory module 102 can be different.

In the example of FIG. 3, each of memory chips 110-1 to 110-8 store actual data (represented as white boxes 302) along with ECC data (represented as hashed boxes 304). In contrast, the other memory chip 110-9 stores just ECC data (represented by hashed boxes 306 and 307). In other implementations, multiple memory chips 110-9 that store just ECC data can be provided.

Each memory chip 110-1 to 110-9 stores multiple codewords, where each codeword includes 10 bytes of data (a byte has 8 bits). Each byte is represented as a box (302, 304, or 306) in the respective memory chip. Thus, in the view of FIG. 3, a column of bytes in a respective memory chip represents a codeword. Although just one codeword is shown in each memory chip in FIG. 3, a memory chip can store multiple codewords.

Within each of memory chips 110-1 to 110-8, 8 bytes (302) of a codeword are used for storing actual data (e.g.

user data, application data, machine-readable instructions, etc.), while 2 bytes (304) of the codeword are used for storing ECC data (which is used for performing error detection and correction). Each memory chip 110-1 to 110-8 also includes an ECC engine 308. During a write, the ECC engine 308 of a memory chip (110-1 to 110-8) produces a codeword that includes 8 bytes (302) of actual data and 2 bytes (304) of ECC data generated based on the 8 bytes (302) of actual data. During a read, the ECC engine 308 applies data error detection and correction to protect the 8 bytes (302) of data in the respective codeword, using the corresponding 2 bytes (304) of ECC data.

In the memory chip 110-9, each byte (306) contains ECC data produced based on respective 8 bytes across a row of the memory chips 110-1 to 110-8. For example, row 310 shown in FIG. 3 includes 8 data bytes 302 across the memory chips 110-1 to 110-8, and an ECC byte 306 in the memory chip 110-9. The ECC data in the ECC byte 306 of row 310 is based on actual data contained in bytes 302 across the memory chips 110-1 to 110-8 in row 310.

The memory chip 110-9 also stores 2 bytes (307) of ECC data that are based on the ECC data in the 8 ECC bytes (306) of the memory chip 110-9. The memory chip 110-9 includes an ECC engine 308 that can compute the ECC data in the 2 bytes (307) from the ECC data in the 8 ECC bytes (306). The 10 bytes of the memory chip 110-9 depicted in FIG. 3 also make up a codeword. The 2 bytes (307) of ECC data are used by the ECC engine 308 to apply data error detection and correction in the codeword made up of the bytes 306 and 307.

Each ECC engine 308 in a corresponding one of the memory chips 110-1 to 110-9 individually performs data error detection and correction for respective codewords stored in the respective memory chip.

On the other hand, the ECC bytes 306 in the memory chip 110-9 are used by the second ECC logic 120 in the memory controller 104 (FIG. 1), to apply error detection and correction for data in a row across the memory chips 110-1 to 110-8.

Although the FIG. 3 example refers to a specific arrangement where each memory chip has a specific number of bytes, it is noted that a different arrangement can be employed in other examples. Each of the boxes 302, 304, 306, and 307 can represent other data sizes (rather than bytes).

In operation, when data is written to the actual data bytes 302 of a memory chip (such as memory chip 110-1, for example), the corresponding ECC data is produced based on the write data. The ECC data is then stored in the ECC bytes 304 of the memory chip 110-1. In addition, when data byte(s) 302 in any one or more of the memory chips 110-1 to 110-8 is (are) changed, the corresponding ECC data is produced (by the second ECC logic 120 in the memory controller 104 of FIG. 1) based on the changed data across multiple memory chips, and stored in the corresponding ECC byte 306 in the memory chip 110-9.

During a read operation, such as a read of the memory chip 110-1, the corresponding ECC engine 308 uses the ECC bytes 304 in the memory chips 110-1 to perform error detection and correction with respect to the actual data bytes 302 in the memory chip 110-1. If data (in the bytes 302) across eight memory chips 110-1 to 110-8 are read, then the corresponding ECC byte 306 from the memory chip 110-9 is also retrieved and provided to the second ECC logic 120 (in the memory controller 104 of FIG. 1) to perform error detection and correction of data read in a row across the memory chips 110-1 to 110-8.

FIG. 4 is a block diagram of the memory module 102 that is operated in the second mode. In the second mode, the ECC engines 308 in the memory chips 110-1 to 110-8 are disabled (as indicated by the X in each ECC engine 308).

Note that FIG. 4 shows just memory chips 110-1 to 110-8 (the ninth memory chip 110-9 is not used in some examples when the memory module 102 operates in the second mode). Note that if the first ECC logic 118 in the memory controller 104 (FIG. 1) is activated when the memory module 102 is in the second mode, the memory chips 110-1 to 110-8 can store ECC data (in addition to actual data) for use by the first ECC logic 118. For example, if the first ECC logic 118 implements the Reed-Solomon block ECC technique, then the corresponding ECC data would be stored in the memory chips 110-1 to 110-8.

Using techniques or mechanisms according to some implementations, more flexible usage of a memory module can be provided. The memory module can be selectively used in different modes, and when used in such different modes, different ECC protection can be provided. The ability to use a common memory module in different modes enhances manufacturing efficiency and reduces cost. Note that the number of ECC bytes per memory chip can be varied, and can be made transparent to the user of the memory module. Different generations or designs of the memory module can use different numbers of ECC bytes per memory chip.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A memory module comprising:
a memory, and
an error correction logic to detect and correct errors in data stored in the memory, wherein the error correction logic is selectively controllable between an enabled state and a disabled state,
wherein the memory is to store data without error protection provided by the memory module if the error correction logic is in the disabled state,
wherein the error correction logic in the memory module is to detect and correct an error in data read from the memory during a read operation, if the error correction logic is in the enabled state, wherein the error correction logic in the memory module is set in the enabled state by an input provided by a memory controller when an error correction logic in the memory controller is disabled, and wherein the memory controller is external of the memory module.

2. The memory module of claim 1, further comprising:
input/output pins to communicate with the memory controller.

3. The memory module of claim 2, wherein the memory is to store data with error protection provided by the memory controller if the error correction logic in the memory module is in the disabled state.

4. The memory module of claim 3, wherein the error protection provided by the memory controller uses an error detection and correction technique that is different from an error detection and correction technique used by the error correction logic in the memory module.

5. The memory module of claim 1, wherein the memory includes a plurality of memory devices, and wherein a subset of the memory devices is to store error correction code for use by the error correction logic in the memory module if the error correction logic in the memory module is in the enabled state.

6. The memory module of claim 5, wherein at least another of the memory devices is to store error correction code based on data across the memory devices of the sub set.

7. The memory module of claim 6, wherein the error correction logic in the memory module comprises a plurality of error correction engines in respective memory devices of the subset of the memory devices.

8. The memory module of claim 7, wherein the memory devices of the subset of the memory devices are to store respective portions of write data of a write operation, and responsive to the error correction logic in the memory module being in the enabled state, each respective error correction engine of the plurality of error correction engines is to, in response to the write operation:

compute an error correction code based on a corresponding data portion of the portions of the write data, and store the corresponding data portion and the computed error correction code in the memory device including the respective error correction engine.

9. The memory module of claim 8, wherein the error correction code based on the data across the memory devices of the subset is computed by the memory controller.

10. The memory module of claim 9, wherein the error correction code in the at least another memory device is useable by the memory controller to apply error detection and correction to data in the memory devices of the subset.

11. The memory module of claim 1, further comprising:
a support substrate on which the memory and the error correction logic in the memory module are provided.

12. The memory module of claim 1, wherein the input provided by the memory controller is through an input/output pin of the memory module.

13. An electronic device comprising:
a memory controller; and
a memory module coupled to the memory controller and comprising:
  a plurality of memory devices, and
  an error correction logic to, responsive to the error correction logic being set in an enabled state:
    generate, for write data written to a first memory device of the plurality of memory devices, a first error correction code, and write the first error correction code to the first memory device, and
    detect and correct an error in data read from the plurality of memory devices during a read operation initiated by the memory controller,
  where the plurality of memory devices are to store data without any error protection provided by the memory module responsive to the error correction logic being in a disabled state,
wherein the memory controller includes an error correction logic to generate a second error correction code based on write data across multiple memory devices of the plurality of memory devices, and
wherein the memory controller is to provide an input to the memory module to set the error correction logic in the memory module to the enable state when the error correction logic in the memory controller is disabled.

14. An electronic device comprising:
a memory controller; and
a memory module coupled to and separate from the memory controller and comprising:
  a memory, and
  an error correction logic to detect and correct errors in data stored in the memory, wherein the error correction logic is selectively controllable between an enabled state and a disabled state,
  where the memory is to store data without any error protection provided by the memory module responsive to the error correction logic being in the disabled state, and
  responsive to the error correction logic being in the enabled state, the error correction logic in the memory module is to detect and correct an error in data read from the memory during a read operation initiated by the memory controller,
wherein the memory controller further includes error correction logic to provide data error protection for data in the memory module when the error correction logic in the memory module is disabled, wherein the memory controller is to provide an input to the memory module to set the error correction logic in the memory module to the enabled state when the error correction logic in the memory controller is disabled.

15. The electronic device of claim 14, wherein the error correction logic of the memory controller is to provide data error protection for data stored across a plurality of memory devices in the memory module.

16. The electronic device of claim 14, wherein the input provided by the memory controller is through an input/output pin of the memory module.

* * * * *